United States Patent
Lu et al.

(10) Patent No.: US 12,287,456 B2
(45) Date of Patent: Apr. 29, 2025

(54) HARD OPTICAL FILM, METHOD FOR PREPARING SAME AND USE THEREOF

(71) Applicant: City University of Hong Kong Shenzhen Futian Research Institute, Guangdong (CN)

(72) Inventors: Jian Lu, Guangdong (CN); Yu Bu, Guangdong (CN)

(73) Assignee: CITY UNIVERSITY OF HONG KONG SHENZHEN FUTIAN RESEARCH INSTITUTE, Guangdong (CN)

( * ) Notice: Subject to any disclaimer, the term of this patent is extended or adjusted under 35 U.S.C. 154(b) by 17 days.

(21) Appl. No.: 18/061,713

(22) Filed: Dec. 5, 2022

(65) Prior Publication Data

US 2024/0045110 A1     Feb. 8, 2024

(30) Foreign Application Priority Data

Aug. 2, 2022 (CN) .......................... 202210924007.7

(51) Int. Cl.
| | |
|---|---|
| *G02B 1/14* | (2015.01) |
| *C23C 14/02* | (2006.01) |
| *C23C 14/14* | (2006.01) |
| *C23C 14/35* | (2006.01) |
| *C23C 14/54* | (2006.01) |

(52) U.S. Cl.
CPC .............. *G02B 1/14* (2015.01); *C23C 14/022* (2013.01); *C23C 14/14* (2013.01); *C23C 14/35* (2013.01); *C23C 14/54* (2013.01)

(58) Field of Classification Search
None
See application file for complete search history.

(56) References Cited

U.S. PATENT DOCUMENTS

| | | | | |
|---|---|---|---|---|
| 7,722,966 | B1* | 5/2010 | Lee | C23C 14/08 |
| | | | | 204/192.15 |
| 2009/0263647 | A1* | 10/2009 | Gangopadhyay | C03C 17/008 |
| | | | | 428/428 |
| 2013/0209762 | A1* | 8/2013 | Damm | C03C 17/3435 |
| | | | | 428/212 |
| 2020/0340125 | A1* | 10/2020 | Lu | C23C 28/343 |

FOREIGN PATENT DOCUMENTS

| | | | |
|---|---|---|---|
| CN | 114438446 A | * | 5/2022 |
| KR | 20180083195 A | * | 7/2018 |

* cited by examiner

*Primary Examiner* — David Sample
(74) *Attorney, Agent, or Firm* — NKL Law; Allen Xue

(57) ABSTRACT

A hard optical film, a method for producing the same and use thereof. The film is an optical film with a nano-dual-phase structure, and features a regulable thickness, high visible light transmittance and hardness, a flat and uniform surface, and a great application prospect. The hard optical film is prepared on a surface of a substrate by magnetron sputtering, having high binding force between the obtained film and the substrate, such that the substrate has a very high hardness, a very strong abrasion resistance and certain corrosion resistance.

11 Claims, 3 Drawing Sheets

HARD OPTICAL FILM, METHOD FOR PREPARING SAME AND USE THEREOF

CROSS-REFERENCE TO RELATED APPLICATION

This application claims the priority of the prior application No. 202210924007.7 submitted to China National Intellectual Property Administration on Aug. 2, 2022, which is entitled "Hard optical film, method for preparing same and use thereof", the content of which is incorporated herein by reference in its entirety.

TECHNICAL FIELD

The present disclosure belongs to the field of film materials, and relates to a hard optical film, a method for preparing the same and use thereof.

BACKGROUND

Hard coatings, as a protective material, have excellent abrasion resistance, as well as high visible light transmittance, and are widely used in the communication and electronic industry. With the upgrading of electronic products, the electronic products widely used in the communication industry are changed from tablet designs to foldable designs. However, for the design of products with foldable screens, materials having high light transmittance and high flexibility are inevitable. Most of the existing products use plastic materials such as PET, PI and the like as the material for foldable screens. However, since the plastic materials have characteristics of low abrasion resistance and low scratch resistance, the plastic materials are prone to conditions such as peeling off and deformation. Glass materials have difficulties in widely application to foldable screens due to their defects of poor flexibility, frangibility and the like. In order to develop a foldable screen, it is imperative to develop a material having high light transmittance and high flexibility and suitable for foldable screens.

SUMMARY

Based on the problem of flexible screen materials for mobile terminal, it is necessary to provide a treatment method for surface enhancement on a substrate, and the nanostructure film prepared by the method can provide high light transmittance, higher hardness, and excellent scratch resistance, corrosion resistance and other capabilities under various external environments for the substrate. Based on this, the present disclosure provides a hard optical film which has various properties such as high hardness, high light transmittance, scratch resistance, corrosion resistance and the like. In addition, the present disclosure further provides a method for preparing the hard optical film, which has advantages of simple process, complete automation and large-scale production, environmental protection, energy saving and low carbon, and wide applicability. The film described above can be applied to a new generation of communication terminals, and has advantages of cost efficiency, high performance and long service life, among others.

Specifically, the present disclosure provides the following technical schemes:

The present disclosure provides a hard optical film, wherein the film is an optical film with a nano-dual-phase structure.

In the present disclosure, the "nano-dual-phase structure" refers to that a nanocrystal structure and an amorphous structure coexist in a microstructure of the film.

According to one embodiment of the present disclosure, a visible light transmittance of the film may be 90% or greater; specifically, the visible light transmittance can be up to 100%. Illustratively, the visible light transmittance can be 90%, 91%, 92%, 93%, 94%, 95%, 96%, 97%, 98%, 99% or 100%.

According to one embodiment of the present disclosure, a hardness of the film may be 10 GPa or greater. Illustratively, the hardness can be 10 GPa, 10.5 GPa, 11 GPa, 11.5 GPa, 12 GPa, 12.1 GPa, 12.2 GPa, 12.5 GPa or greater.

According to one embodiment of the present disclosure, a material constituting the film is selected from at least one of an oxide of a metal alloy, a nitride of a metal alloy and the like. Specifically, the metal alloy can form an amorphous structure; illustratively, the metal alloy can be at least one of the metal alloys which can form an amorphous structure: an MgZnCa alloy, an MgCuY alloy, a ZrTiFe alloy, an AlNiY alloy and the like.

According to one embodiment of the present disclosure, a thickness of the film may be from 50 nm to 5000 nm. Illustratively, the thickness can be 50 nm, 60 nm, 70 nm, 80 nm, 90 nm, 100 nm, 150 nm, 200 nm, 500 nm, 1000 nm, 2000 nm, 3000 nm, 4000 nm or 5000 nm.

The present disclosure further provides a composite film, which comprises a substrate layer and the hard optical film described above on a surface at one side of the substrate layer.

According to one embodiment of the present disclosure, the substrate layer is selected from a 3D printed glass or ceramic, a soft substrate (such as a film suitable for a mobile phone screen), a flexible ultra-thin glass or the like.

The present disclosure also provides use of the composite film, wherein the composite film is used as a mobile phone screen, a backboard, an optical lens or the like.

The present disclosure also provides a method for preparing the hard optical film, comprising the following steps:
1) loading a material for forming the hard optical film, namely a target material, into a position for the target material in a magnetron sputtering coating machine;
2) putting a substrate into the magnetron sputtering coating machine;
3) vacuumizing the coating machine to a vacuum state, adjusting the power, introducing argon, and performing a plasma pretreatment for the substrate; and
4) adjusting the power, introducing argon and reaction gases, coating, and forming the hard optical film on a surface of a plasma-pretreated substrate.

In the present disclosure, the hard optical film is prepared by using a cost-efficient, environment-friendly and efficient magnetron sputtering coating technique. As a film preparation means, magnetron sputtering coating allows film material to grow on various substrates at higher densities, including materials having complicated shapes, soft and ultra-thin materials and the like, such as a 3D printed glass or ceramic, a soft substrate (such as a film suitable for a mobile phone screen) or a flexible ultra-thin glass, and can provide higher binding force between the film and the substrate. The present disclosure can treat various substrates by automatically controlling the magnetron sputtering, deposits a layer of an optical film having high light transmittance (visible light transmittance), excellent mechanical property and a nano-dual-phase structure on a surface of a substrate, and greatly improves the hardness, abrasion resistance and corrosion resistance of the substrate while retaining the high light transmittance of the substrate.

Specifically, the width of the forbidden band in a valence band structure of the film of the present disclosure prepared by magnetron sputtering is greater than the ultraviolet light energy value, and the film can transmit light waves in the visible light band. The formed structure of the material and the valence band and defects can be regulated by controlling specific parameters of the reactive sputtering process (i.e., aboved step 4)), so as to obtain the film of the present application having a visible light transmittance of at least 90%.

According to one embodiment of the present disclosure, in step 1), the target material is selected from a metal alloy. The metal alloy can form an amorphous structure; illustratively, the metal alloy can be at least one of metal alloys which can form an amorphous structure: an MgZnCa alloy, an MgCuY alloy, a ZrTiFe alloy, an AlNiY alloy and the like.

According to one embodiment of the present disclosure, the target material can be pretreated prior to being loaded into the position for target material in the magnetron sputtering coating machine.

Specifically, the pretreatment comprises: polishing, washing (specifically, it can be ultrasonic washing) and drying. Specifically, the polishing is to polish a surface layer of the target material by using a sandpaper. Specifically, the ultrasonic washing can be ultrasonic washing in acetone, ethanol and deionized water.

According to one embodiment of the present disclosure, the material of the target material used in step 1) requires a precisely calculated composition ratio to form an optical film having an optimal composition and/or structure and a nano-dual-phase structure. Specifically, taking MgZnCa as an example, the atomic ratio of Mg to the other two metal atoms may be (40-60):(60-40), for example, 40:60, 45:55, 50:50, 55:45 or 60:40; the atomic ratio of Zn to Ca may be (10-5):1, for example, 10:1, 9:1, 8:1, 7:1, 6:1 or 5:1; illustratively, the atomic ratio of the three may be 60:35:5, but is also not limited thereto.

According to one embodiment of the present disclosure, in step 3), the plasma pretreatment requires precise control of the sputtering power and/or a partial pressure of argon in the chamber. Specifically, the power can be controlled at 200-800 W but is also not limited thereto, and the partial pressure of argon in the chamber can be controlled at 60%-80% but is also not limited thereto.

According to one embodiment of the present disclosure, in step 3), the flux of argon can be controlled at 30-50 sccm; illustratively, the flux can be 30 sccm, 35 sccm, 40 sccm, 45 sccm or 50 sccm.

According to one embodiment of the present disclosure, in step 3), the vacuum state has a vacuum degree of $10^{-3}$-$10^{-9}$ torr.

According to one embodiment of the present disclosure, in step 4), the bombardment efficiency of plasmas and electrons on the target material can be regulated by controlling the partial pressure of argon, the partial pressure of the reaction gas (such as $O_2$ or $N_2$), the sputtering power, the temperature and other conditions according to the target material, such that the substrate and the film are firmly bonded, and the microstructure (including the nano-dual-phase structure, the valence band structure, the defects and the like) of the film can be controlled to obtain the desirable visible light transmittance and mechanical property.

Specifically, step 4) comprises: adjusting the sputtering power, controlling the temperature, simultaneously introducing argon and $O_2$ or $N_2$, and coating the surface of the plasma-pretreated substrate to form the hard optical film. Specifically, the temperature is controlled at room temperature to 1000° C. Specifically, the sputtering power can be controlled at 200-800 W but is not limited thereto. Specifically, the partial pressure of argon in the chamber can be controlled at 60%-80% but is not limited thereto, and the partial pressure of the reaction gas in the chamber can be controlled at 20%-40% but is not limited thereto.

According to one embodiment of the present disclosure, in step 4), the flux of argon can be controlled at 30-50 sccm; illustratively, the flux can be 30 sccm, 35 sccm, 40 sccm, 45 sccm or 50 sccm.

According to one embodiment of the present disclosure, in step 4), the flux of the reaction gas can be controlled at 5-30 sccm; illustratively, the flux can be 5 sccm, 10 sccm, 15 sccm, 20 sccm, 25 sccm or 30 sccm.

The principle of the present disclosure is as follows: by surface coating on the substrate using magnetron sputtering coating, in step 4), the sputtering rate of target material atoms can be adjusted by controlling the sputtering power, so as to form a high-transmittance hard film layer having a suitable thickness; in addition, a film having a nano-dual-phase structure is formed by controlling the partial pressure of argon and the partial pressure of the reaction gas. The present disclosure forms the high-transmittance film having a nano-dual-phase structure by using magnetron sputtering, which not only improves mechanical property, abrasion resistance and corrosion resistance of the substrate can be improved, but also increases the visible light transmittance of the film coating. The present disclosure further comprises a step of plasma pretreatment on the substrate, i.e., step 3), prior to coating, and the introduction of the step is intended to remove impurity atoms on the surface of the substrate and to improve a bonding force between the substrate and the film.

The present disclosure has the following advantages.
1. The present disclosure provides a hard optical film, which has a nano-dual-phase structure, and features a regulable thickness, high visible light transmittance and hardness, a flat and uniform surface, and a great application prospect.
2. The hard optical film is prepared on a surface of a substrate by magnetron sputtering, having high binding force between the obtained film and the substrate, such that the substrate has a very high hardness, a very strong abrasion resistance and certain corrosion resistance.
3. The present disclosure can prepare the hard optical film on the substrate made of different materials by using magnetron sputtering, and the film has a high visible light transmittance, and can thus keep the original optical property (such as the high visible light transmittance) of the substrate while protecting the substrate.
4. The substrate of the present disclosure can be a soft substrate, such that the prepared composite film can be folded for multiple times, keeps a high visible light transmittance and a mechanical protection effect, and is particularly suitable for the fields of mobile phone screens and the like.

DETAILED DESCRIPTION

Figure 1:
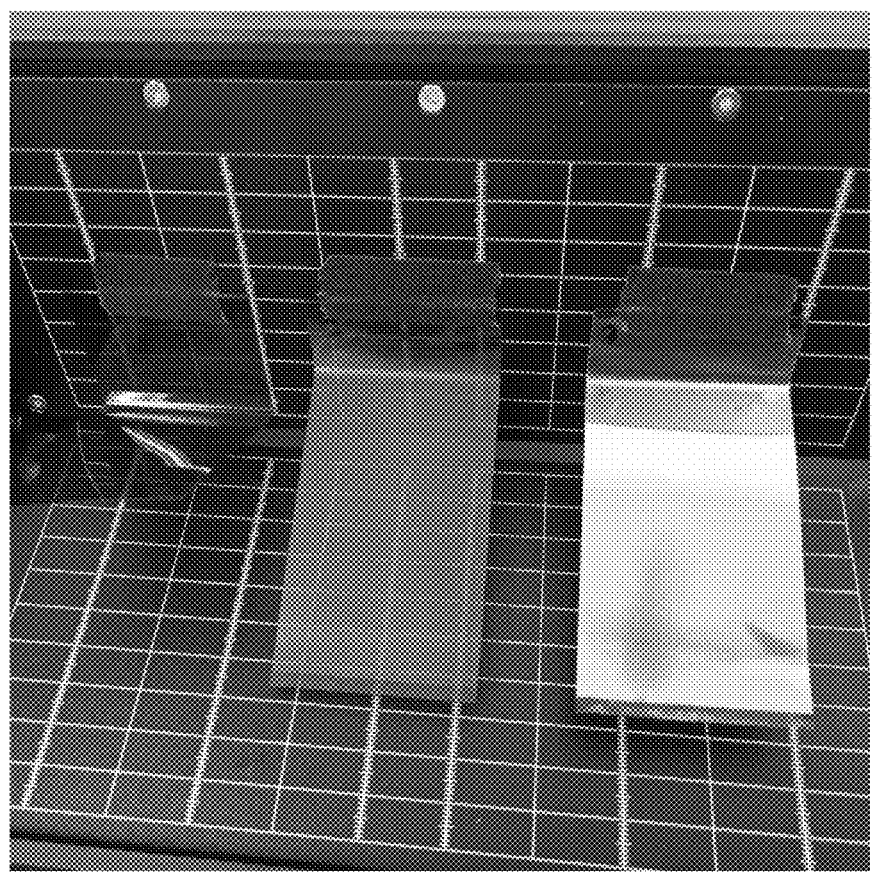
FIG. 1 is a photograph of a PI material coated with the hard optical film disclosed herein in Example 2 of the present disclosure, which is folded 10,000 times, showing an uncoated PI (left), a PI coated with the film of the present disclosure (middle), and a PI coated with a metal film (right)

The technical scheme of the present disclosure will be further illustrated in detail with reference to the following specific examples. It should be understood that the following examples are merely exemplary illustration and explanation of the present disclosure, and should not be construed as limiting the protection scope of the present disclosure. All techniques implemented based on the content of the present disclosure described above are encompassed within the protection scope of the present disclosure.

Unless otherwise stated, the starting materials and reagents used in the following examples are all commercially available products or can be prepared by known methods.

In the present disclosure, the visible light transmittance was determined by an ultraviolet-visible spectrophotometer, the sample size was 20×20 mm$^2$, and the thickness range of the sample (film) was 200 nm-800 nm.

In the present disclosure, the hardness was determined by a nanoindenter using a nanoindentation method. For samples with a depth of indentation being ⅒ or greater of the material thickness, the sample size was 20×20 mm$^2$, and the thickness range of the sample (film) was 200 nm-800 nm.

Example 1

(1) An MgZnCa alloy (wherein an atomic ratio of Mg, Zn and Ca was 60:35:5) was used as the target material, and pretreated as follows: the surface layer of the target material was polished using a sandpaper, ultrasonically washed in acetone, ethanol and deionized water, and dried. The pretreated target material was loaded into a position for the target material in a magnetron sputtering coating machine.

(2) A flexible material PET substrate (such as a plastic sheet having a thickness of 100 μm) was soaked in ethanol and deionized water for ultrasonic washing for 20-30 min, impurities of the surface were removed to obtain a washed substrate, and the washed substrate was putted into the magnetron sputtering coating machine.

(3) The coating machine was vacuumized to a vacuum state of $10^{-3}$-$10^{-9}$ torr, the power was adjusted, argon is introduced, and plasma pretreatment was performed on the substrate. The step was to remove the impurities (the impurities refer to oil stain, dust and the like attached to the surface of the target material, which were to be removed through pretreatment to ensure the purity of sputtered atoms) of the surface of the target material and to improve the binding force between the substrate and the film. Specifically, the power was controlled at 450 W, and argon had a partial pressure of 65% and a flux of 40 sccm.

(4) After the pretreatment was finished, a coating treatment was performed. The power was adjusted, the temperature was selected from room temperature to 1000° C., and argon and $O_2$ or $N_2$ were introduced simultaneously for coating. The power was controlled at 320 W; argon was introduced at a flux of 40 sccm, and the $O_2$ ($N_2$) was introduced at a flux of 10 sccm; the partial pressure of argon was controlled at 65%, and the partial pressure of the $O_2$ or $N_2$ was controlled at 35%.

Figure 5:
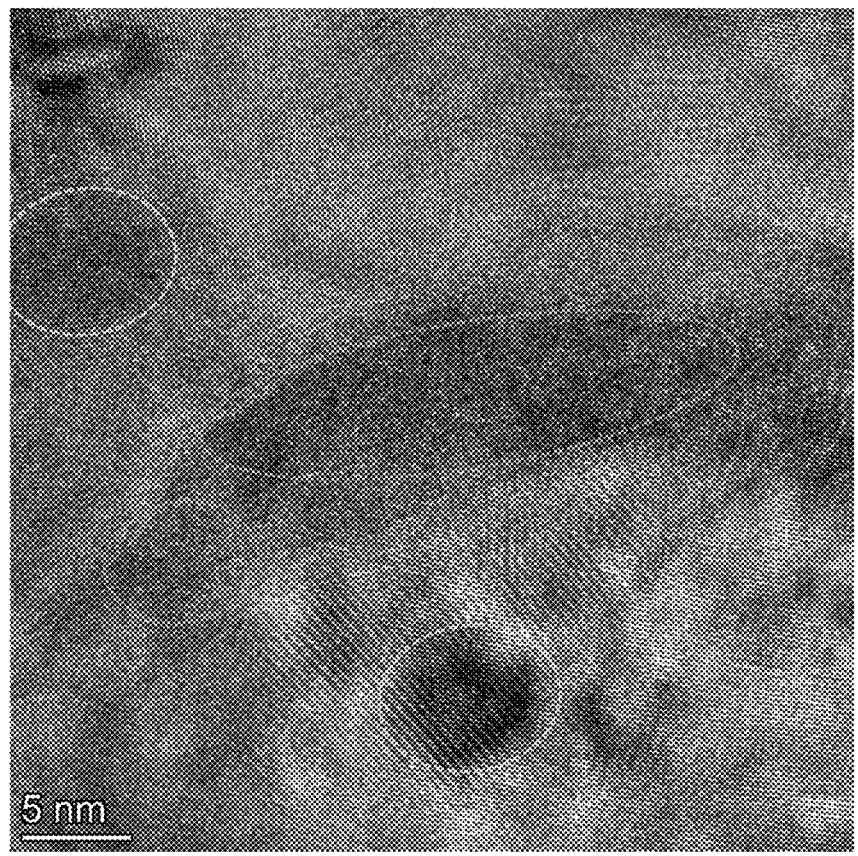
FIG. 5 is a transmission micrograph of the hard optical film disclosed herein in Example 2 of the present disclosure.

The film prepared by the present disclosure had a nano-dual-phase structure, as specifically shown in FIG. 5.

By detection, the thickness of the film was 50-5000 nm.

By detection, the average light transmittance of the film was 90% or greater in the visible light range.

By detection, the hardness of the film was 12.2 GPa.

Example 2

This example was different from Example 1 in that in step 2), a soft material PI film, was selected as the substrate instead of the flexible material PET substrate in Example 1; and the rest was the same as that in Example 1.

By detection, the thickness of the film was 100 nm-5000 nm.

FIG. 1 shows the photograph of the PI material after 10,000 times of folding, wherein the left panel shows the uncoated PI, the middle panel shows the PI coated with the hard optical film disclosed herein in Example 2, and the right panel shows the PI coated with a metal film. As can be seen, the untreated PI film (left) demonstrated significant deformation after ten thousand times of folding and was unable to restore; whereas, the coated PI films (middle and right) had higher rigidities, and the PI film coated with the hard optical film disclosed herein had higher transparency; specifically, it can be seen from the middle and right panels of FIG. 1 that the middle panel is transparent, i.e., the color (brown) of the substrate PI, while the right panel shows the silver color of metals and opacity.

Figure 2:
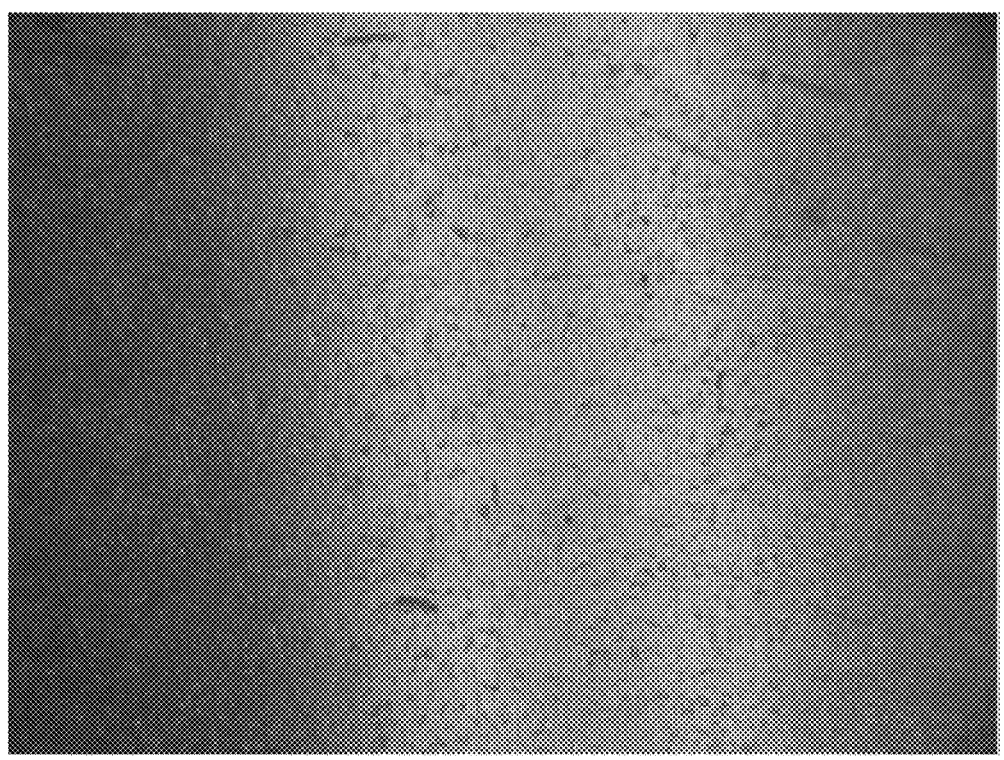
FIG. 2 is an optical microscopy photograph of the PI material coated with the hard optical film disclosed herein in Example 2 of the present disclosure, which is folded 10,000 times (without folds)

FIG. 2 shows the optical microscopy photograph of the PI material coated with the hard optical film disclosed herein in Example 2 of the present disclosure, which was folded 10,000 times (without folds) with a folding radius of 1 mm. It can be seen from the drawing that the film had no folds or cracks.

Figure 3:
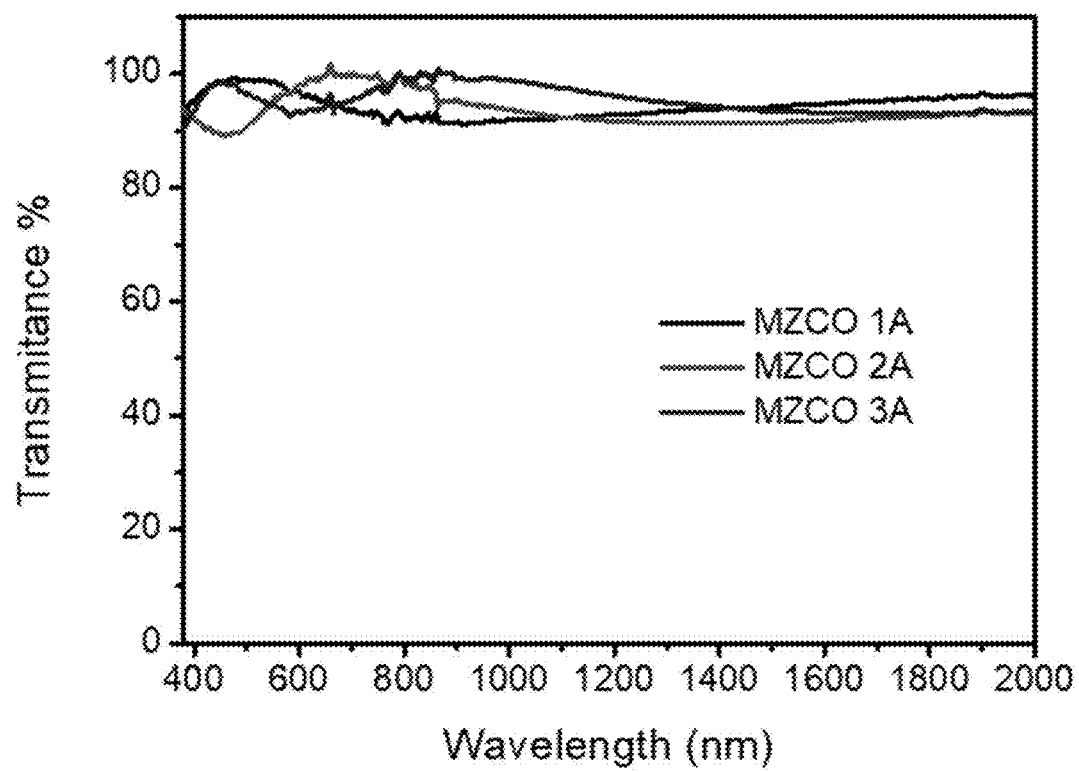
FIG. 3 shows the light transmittance of the hard optical film of Example 2 of the present disclosure in the visible light range.

As shown in FIG. 3, the hard optical MgZnCa oxide film of the present disclosure in Example 2 had an average light transmittance of 90% or greater in the visible light range.

Figure 4:
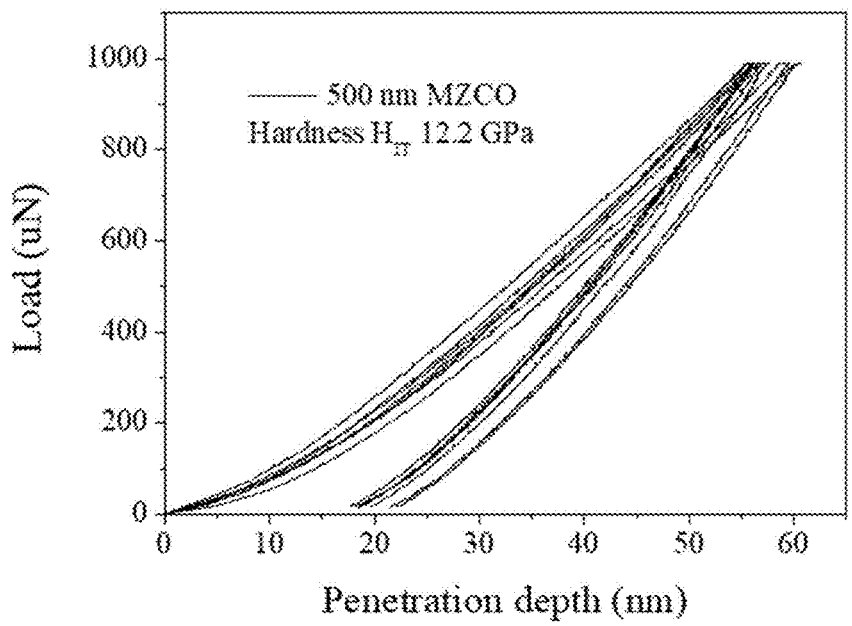
FIG. 4 shows a nanoindentation loading hardness test of the hard optical film of Example 2 of the present disclosure.

As shown in FIG. 4, the hard optical MgZnCa oxide film of the present disclosure in Example 2 had a hardness of 12.2 GPa.

As shown in FIG. 5, the transmission micrograph of the hard optical film of the present disclosure in Example 2 shows that the film had a nanocrystal (blue region) and an amorphous structure (orange region), i.e., had a nano-dual-phase structure.

The exemplary embodiments of the present disclosure have been described above. However, the protection scope of the present application is not limited to the above embodiments. Any modification, equivalent, improvement and the like made by those skilled in the art without departing from the spirit and principle of the present disclosure shall fall within the protection scope of the present disclosure.

The invention claimed is:

1. An optical film comprises at least one of an oxide and a nitride of a metal alloy, wherein the metal alloy is a ternary alloy selected from a MgZnCa alloy, a MgCuY alloy, a ZrTiFe alloy, and an AlNiY alloy, and wherein the optical film has a nano-dual phase structure and a visible light transmittance of 90% or greater.

2. The optical film according to claim 1, wherein a hardness of the optical film is 10 GPa or greater.

3. The optical film according to claim 1, wherein a thickness of the optical film is from 50 nm to 5000 nm.

4. A composite film, comprising a substrate layer and the optical film according to claim 1 disposed on a surface at one side of the substrate layer.

5. The composite film according to claim 4, wherein the substrate layer is selected from a 3D-printed glass, a 3D-printed ceramic, a soft substrate, and a flexible glass.

6. A mobile phone screen, a backboard or an optical lens, which comprises the composite film according to claim 4.

7. A method for preparing the optical film according to claim 1, comprising the following steps:

1) loading a target material in a magnetron sputtering coating machine;

2) putting a substrate into the magnetron sputtering coating machine;

3) vacuumizing the magnetron sputtering coating machine, adjusting a sputtering power, introducing argon, and performing a plasma pretreatment for the substrate; and 4) adjusting the sputtering power, introducing argon and a reaction gas, coating, and forming the optical film on a surface of a plasma-pretreated substrate.

8. The method according to claim 7, wherein in step 1), the target material is a metal alloy selected from an MgZnCa alloy, an MgCuY alloy, a ZrTiFe alloy and an AlNiY alloy.

9. The method according to claim 7, wherein in step 4), the reaction gas is $O_2$ or $N_2$.

10. The method according to claim 7, wherein in step 3), the sputtering power is controlled at 200-800 W and a partial pressure of argon in a chamber of the magnetron sputtering coating machine is controlled at 60%-80%.

11. The method according to claim 7, wherein in step 3), a pressure in a chamber of the magnetron sputtering coating machine is $10^{-3}$-$10^{-9}$ torr.

* * * * *